United States Patent [19]

Wood

[11] Patent Number: 4,555,784
[45] Date of Patent: Nov. 26, 1985

[54] PARITY AND SYNDROME GENERATION FOR ERROR DETECTION AND CORRECTION IN DIGITAL COMMUNICATION SYSTEMS

[75] Inventor: Roger W. Wood, Manteca, Calif.

[73] Assignee: Ampex Corporation, Redwood City, Calif.

[21] Appl. No.: 586,526

[22] Filed: Mar. 5, 1984

[51] Int. Cl.$^4$ .............................................. G06F 11/00
[52] U.S. Cl. ......................................... 371/37; 371/38
[58] Field of Search .......................... 371/37, 38, 39, 40

[56] References Cited

U.S. PATENT DOCUMENTS

| | | | |
|---|---|---|---|
| 3,137,788 | 6/1964 | Froggatt | 371/54 |
| 3,227,865 | 1/1966 | Hoernes | 371/54 |
| 3,349,370 | 10/1967 | Garrett | 371/55 |
| 3,439,331 | 4/1969 | Brown et al. | 340/146.1 |
| 3,495,215 | 2/1970 | McManus et al. | 371/26 |
| 3,781,829 | 12/1973 | Singh | 371/27 |
| 3,794,819 | 2/1974 | Berding | 235/153 AM |
| 4,162,480 | 7/1979 | Berlekamp | 340/146.1 AL |
| 4,202,018 | 5/1980 | Stockham, Jr. | 360/47 |
| 4,211,997 | 7/1980 | Rudnick et al. | 371/38 |
| 4,281,355 | 7/1981 | Wada et al. | 360/32 |
| 4,357,702 | 11/1982 | Chase et al. | 371/1 |

FOREIGN PATENT DOCUMENTS

| | | | |
|---|---|---|---|
| 1080328 | 4/1960 | Fed. Rep. of Germany . | |
| 1184498 | 3/1970 | United Kingdom | 371/54 |
| 2038145 | 7/1980 | United Kingdom | 371/54 |

OTHER PUBLICATIONS

Berlekamp, Elwyn R., Algebraic Coding Theory, McGraw Hill Book Company, New York 1968, pp. 44-47.
Kessler, W. D., and J. H. Stein, "A High-Performance Error Correction System for Digital Tape Recorders," International Telemetering Conference Proceedings, Oct. 13-15, 1981, vol. 17, pp. 363-373.
Berlekamp, Elwyn R., "Bit—Serial Reed—Solomon Encoders," IEEE Transactions on Information Theory, vol. IT-28, No. 6, Nov. 1982, pp. 869-874.

Primary Examiner—Michael R. Fleming
Attorney, Agent, or Firm—Robert K. Schumacher; Elizabeth E. Strnad; Joel D. Talcott

[57] ABSTRACT

A parity and/or syndrome generator generates a block parity check for the detection and/or correction of errors in a multi-channel digital data communication system using a linear code or a coset of such code in which data and parity bytes are intended to be digitally encoded in n by m bit data blocks to form a respective codeword in n parallel bytes of m bits in serial order of significance in the form of a codeword having n elements represented by respective bytes in the Galois field GF($2^m$), such Galois field being defined by an m-order field generator polynomial in integral powers of z between $z^0$ and $z^m$, where z is the inverse of the delay operator $z^{-1}$ of such Galois field. A first circuit produces a first partial parity check for the bit of such significance in each of the n elements of the respective codeword. A second circuit sums in the Galois field over all elements of the codeword the first partial parity checks to form a second partial parity check. A third circuit multiplies the bit content of each of a plurality of m-bit registers by the inverse of the delay operator in the Galois field and produces respective m-bit products and sums the products with the second partial parity checks to form a third parity check. Clock pulses synchronously clock the data block bits in the order of significance byte-parallel into the first circuit, clock the third parity check into the m-bit registers, and clear the m-bit registers after m bits.

3 Claims, 6 Drawing Figures

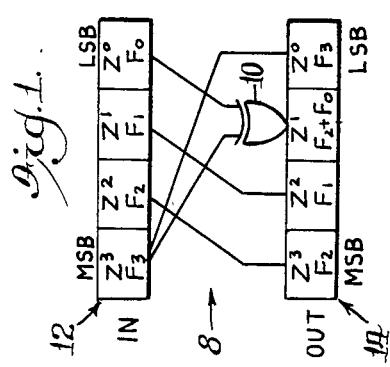

PARITY AND SYNDROME GENERATION FOR ERROR DETECTION AND CORRECTION IN DIGITAL COMMUNICATION SYSTEMS

The present invention relates to error detection and correction in digital communication systems and particularly to the generation of parity and syndrome signals for such error correction. Still more particularly the present invention relates to parity and syndrome generation for error correction in multi-channel digital data communication systems using a linear code or a coset of such code, particularly a cyclic code, more particularly a Reed-Solomon code.

The present invention finds particular application to parity and syndrome generation in error correcting systems of the sort generally described in Berlekamp U.S. Pat. No. 4,162,480, issued July 24, 1979 for Galois Field Computer. Portions of that reference will be repeated herein at some length and the rest is hereby incorporated herein by reference. Such error correcting systems have been provided for data encoded in byte-serial data blocks. The present invention is directed to data recorded in byte-parallel, bit-serial form on multi-track instrumentation recorders for high speed recording.

BACKGROUND OF THE INVENTION

Information transmitted over a communication channel, including a tape recorder, is generally received as a combination of the original information signal and a noise component. Integrity of the information content is almost entirely preserved when the signal to noise ratio of the system is large. Accordingly, refinements in design and realization of the appropriate hardware can increase the probability of error-free transmission, theoretically up to the limits imposed by the channel itself. In order to minimize the effect of intrinsic channel limitations, various techniques are employed which ultimately require a compromise between bandwidth and information transfer rate. Various limitations imposed on the channel bandwidth, information rate, and the degree of complexity of receiving and transmitting apparatus contribute to a probable error rate.

Although redundancy is a common element among these techniques, mere repetition exacts a heavy penalty in transmission rate. For example, a single repetition reduces the information rate 50 percent and a second repetition (to implement majority logic) reduces the information rate by $66\frac{2}{3}$ percent. Other means for assuring message integrity have employed sophisticated coding techniques which permit the detection, location, and correction of errors. Among the desiderata of these coding techniques are high information rate and a capability of correcting multiple errors within any given codeword of transmitted data.

In this context a codeword of n elements results from encoding operations performed upon the elements of the original data comprising k elements to yield an encoded word ("codeword") of information having k information elements and n-k check elements. The encoded redundancy in the form of n-k check elements is then available during the decoding operations to detect and correct errors in the codeword (including all information and check elements) up to some limit or merely to detect errors up to some larger limit.

Many such codes, having distinct mathematical properties, have been studied and mathematically efficient encoding and decoding procedures have been devised, but reduction to practice with concomitant efficiency requires a special purpose computer. For example, certain classes of codes are founded on association of each information element of a codeword with an element of a Galois field. Very briefly, the Galois field is a finite field defined by a field generator, the elements of which field may be represented as polynomials in a particular primitive field element, with coefficients in the prime subfield. If the coefficients are presented in serial form with the most significant coefficient first, field elements can alternatively be considered polynomials in z, where $z^{-1}$ is the delay operator.

Encoding is done by adding redundant elements to the source data elements in order to make the resulting codeword satisfy prescribed parity checks. Each prescribed parity check is formed as a weighted sum of the elements in the codeword. The result of each prescribed parity check upon decoding is generally referred to as a syndrome. In the absence of errors for a linear code, all the syndromes are zero, meaning that the weighted sum of the elements forming each parity check is zero, and the presence of errors is recognized by a non-zero syndrome. In the absence of errors for the coset code of a linear code, all the syndromes have some prescribed non-zero values, and the presence of errors is recognized by departures from the prescribed non-zero values. Cyclic codes, such as Reed-Solomon codes, are a subset of linear codes. The elements of a cyclic codeword can be associated with coefficients of a codeword polynomial. The formation of parity checks can be equated with the taking of a remainder upon division of the codeword polynomial by the code generator polynomial for the code. The locations of errors and the true value of the erroneous information elements are determined after constructing certain polynomials defined on the Galois field and finding the roots of these polynomials. An encoder and decoder are, therefore, required which have the capability of performing Galois field arithmetic.

The same parity check circuit may be used for encoding and decoding, that is, for generating parity and syndrome bytes. In encoding, the data may be taken in data blocks and associated with coefficients of what may be called a data polynomial. The formation of parity checks can be performed identically as in the case of codewords to determine whether or not the data polynomial itself is divisible by the code generator polynomial. If not, the remainder is added to the data polynomial to form the codeword polynomial. Thus the remainder, whether parity or syndrome bytes, may be referred to as a parity check. For the same reasons, the term "data block bits" refers to bits corresponding to the coefficients of either the data polynomial or the codeword polynomial, as the case may be.

Of the error correcting codes, a particular class of such codes, separately described by Bose, Chaudhuri and Hocquenhem (thus "BCH" codes), are capable of multiple error correction. Special cases of such codes are the Reed-Solomon (RS) codes with respect to which the present invention will be described.

The Berlekamp patent includes a review of the salient aspects of coding theory, applicable to nonbinary BCH codes in general and to RS codes in particular. As a general reference, Berlekamp, Algebraic Coding Theory (McGraw-Hill, 1968), is recommended. In a binary realization, such codes may be regarded as having three principal positive integer parameters, n, m, and t, where n is the total length in m-bit characters of a word of encoded information, $n=2^m-1$, and t is the error correcting capability of the code. Assuming no fewer than 2t redundant characters or check characters such a codeword is capable of providing sufficient informational redundancy to detect and correct any set of t or fewer independent errors within the codeword of encoded information, or to correct any set of 2t or fewer independent erasures. An erasure may be defined as an error of known location within the received codeword.

The properties of an algebraic finite field may be summarized briefly. For the purposes of the present invention, a field may be informally defined as a set of elements including the null element, 0, and the unit element, 1, upon which are defined operations of addition, multiplication and division. Addition and multiplication are associative and commutative, and multiplication is distributive with respect to addition. Every element of the field has a unique negative such that the negative of a given element summed with that given element itself yields the null or 0. Further, every non-zero element has a unique reciprocal such that the product of such an element with its reciprocal yields the unit element, 1. The elements comprising the field may be considered symbolic representations of binary or ternary or q-ary numbers. The description of the invention will be understood best in terms of a field of characteristic two.

The general finite field is called the Galois field and is specified by two parameters; a prime p, and an integer m, whereby $GF(p^m)$ describes a unique finite field (the Galois field of order $p^m$) having $p^m$ elements. In such a field all operations between elements comprising the field yield results which are again elements of the field. For example, the operation of addition carried out on elements of the finite field GF(2) is defined, modulo 2, according to relations which do not admit of a "carry". Thus, the binary addition tables are: $0+1=1+0=1$ and $0+0=1+1=0$. Arithmetically, this is a "carry-less" addition, sometimes referred to as half addition and more commonly denoted as the exclusive-OR (XOR). It is apparent that absence of a carry thereby limits the magnitude of the resulting sum to the finite field.

The mathematical basis of Reed-Solomon codes and decoding thereof, as discussed in greater detail in Chapter 10 of Algebraic Coding Theory is as follows:

Let $\alpha^b$ be a primitive element in $GF(2^m)$. The code generator polynomial is defined by $$g(x) = \sum_{i=f}^{f+d-2} (x - \alpha^{ib})$$

where b, d, f and i are integers and d is the code's designed distance. The block length of the Reed-Solomon code is $n=2^m-1$. The codewords consist of all polynomials of degrees less than n which are multiples of g(x).

Let C(x) be the transmitted codeword, $$C(x) = \sum_{i=0}^{n-1} C_i x^i.$$

If the channel noise adds to this codeword, the error pattern $$E(x) = \sum_{i=0}^{n-1} E_i x^i,$$

then the received word is $$R(x) = \sum_{i=0}^{n-1} R_i x^i = C(x) + E(x).$$

The received codeword may be passed through a re-encoder (also known as a syndrome generator) which produces as its output the remainder of the polynomial division S(x) = Remainder [R(x)/g(x)] = Remainder [E(x)/g(x)] from which may be derived the weighted power-sum symmetric functions defined by $$\overline{S}_{ib} = S(\alpha^{ib}) = E(\alpha^{ib})$$

from which may be derived the location and nature of any errors, and appropriate corrections can be made, all as described in the Berlekamp patent.

In order to perform such error correction, it is necessary to encode the source data into codewords and to identify errors in the recovered codewords. This is done by adding parity bytes to the bytes of source data to generate codewords satisfying certain parity checks and by identifying departures from such parity checks in the recovered codewords as syndromes. Such are the functions performed by the present invention for byte-parallel, bit-serial data recorded on multi-track instrument recorders. A particular embodiment actually constructed was for an available 14-channel digital instrumentation tape recorder.

The present invention utilizes the properties of an algebraic finite field as stated above, namely, that addition and multiplication are associative and commutative, and multiplication is commutative with respect to addition. This permits each of the coefficients of the data and codeword polynomials to be separately divided to produce remainders, which may then be added together to form the remainders for the division of the entire polynomial.

Such properties have been utilized in the prior art. Conventionally, data and codewords have been presented byte-serially, bit serially, with the most significant bytes and bits presented first. That is, $C_{n-1}$ is presented first in bit order, then $C_{n-2}$ on down to $C_0$. It is well known to accumulate the bits of each coefficient in a shift register and then divide each coefficient by the code generator polynomial in an appropriate Galois field and appropriately combining the remainders in respect to each coefficient to produce a block parity check. This prior art system thus operates on data byte-serial, bit-parallel.

SUMMARY OF THE INVENTION

The present invention utilizes these same arithmetic properties of the Galois field in respect to data presented byte-parallel, bit-serial. The Galois field properties permit each coefficient to be operated upon one bit at a time for the same reasons, the partial parity check for the first bit being operated upon m−1 times by z, where z is the inverse of the delay operator $z^{-1}$ of such Galois field, the next bit m−2 times, on down to the next to last bit. These partial parity checks may then be combined to form the m-bit block parity check. In accordance with the present invention, the data block polynomials (including codewords) are divided by the code generator polynomial by taking the coefficients of the data block polynomials byte-parallel, bit-serial. The first bits, conventionally the most significant, are used as the dividend in Galois field division by the code generator polynomial to produce a remainder, which may be termed a partial parity check. This remainder is multiplied by $z^{m-1}$. Successive bits are similarly divided and multiplied to produce respective remainders (partial parity checks) for all bits. These are added to produce the overall remainder as a block parity check, i.e., the parity bytes or syndrome. The same code generator polynomial division is effected for each bit, simplifying the circuitry, and the overall remainder is obtained after m clock cycles, i.e., after all m bits have been entered and operated upon. It is thus much faster than and distinguishes from the above-mentioned prior art systems in which bit-parallel, byte-serial signals were operated upon a byte at a time, requiring n clock cycles, hence requiring more processing time. In certain situations such as multi-track tape recording, it is advantageous to transmit or record in byte-parallel, bit-serial form, because byte errors on different channels are often relatively independent, and the performance of the code is thus improved. This invention is particularly appropriate for use in the above-identified applications because it avoids the format translation required by the prior art systems, such as shown in FIG. 3. Substantially the same system and method are utilized for both parity and syndrome generation.

It is thus an important aspect of the present invention to provide a parity and syndrome generator for generating a block parity check for the detection and/or correction of errors in multi-channel digital data communications using a linear code or a coset of such code in which data and parity bytes are intended to be digitally encoded in n by m bit data blocks to form a respective codeword in n parallel bytes of m bits in serial order of significance in the form of a codeword having n elements represented by respective bytes in the Galois field GF($2^m$), such Galois field being defined by an m-order field generator polynomial in integral powers of z between $z^0$ and $z^m$, where z is the inverse of the delay operator $z^{-1}$ of such Galois field. A first circuit responsive to byte-parallel data block bits of the same significance produces a first partial parity check having m-bits in each byte for the bit of such significance in each of the n elements of the respective codeword. A second circuit sums in the Galois field over all elements of the codeword the first partial parity checks to form a second partial parity check having m-bits in each byte. A third circuit multiplies the bit content of each of a plurality of m-bit registers by the inverse of the delay operator in the Galois field and produces respective m-bit products and sums the m-bit products with the second partial parity checks to form a third parity check having m bits in each byte. A clock provides clock pulses for synchronously clocking the data block bits in the order of significance byte-parallel into the first circuit, clocking the third parity check into the m-bit registers, and clearing the m-bit registers after m bits.

Another aspect is to provide such generator operating on data blocks in byte-parallel, bit-serial form for the correction of errors in data recorded with a multitrack digital recorder using a Reed-Solomon or other cyclic code. Other aspects, objects and advantages of the present invention will become apparent from the following detailed description, particularly when taken in connection with the accompanying drawings.

SUMMARY OF THE DRAWINGS

FIG. 1 is a diagrammatic illustration of a simple circuit for multiplication by z in a particular Galois field GF(16);

FIG. 2 is a diagrammatic illustration of a simple circuit for multiplication by $\alpha^{14}=\alpha^{-1}$ in the same Galois field GF(16);

FIG. 4 is a diagrammatic illustration of a byte-parallel, bit-serial encoding and recording system utilizing the parity/syndrome generator of the present invention;

DETAILED DESCRIPTION

Figure 3:
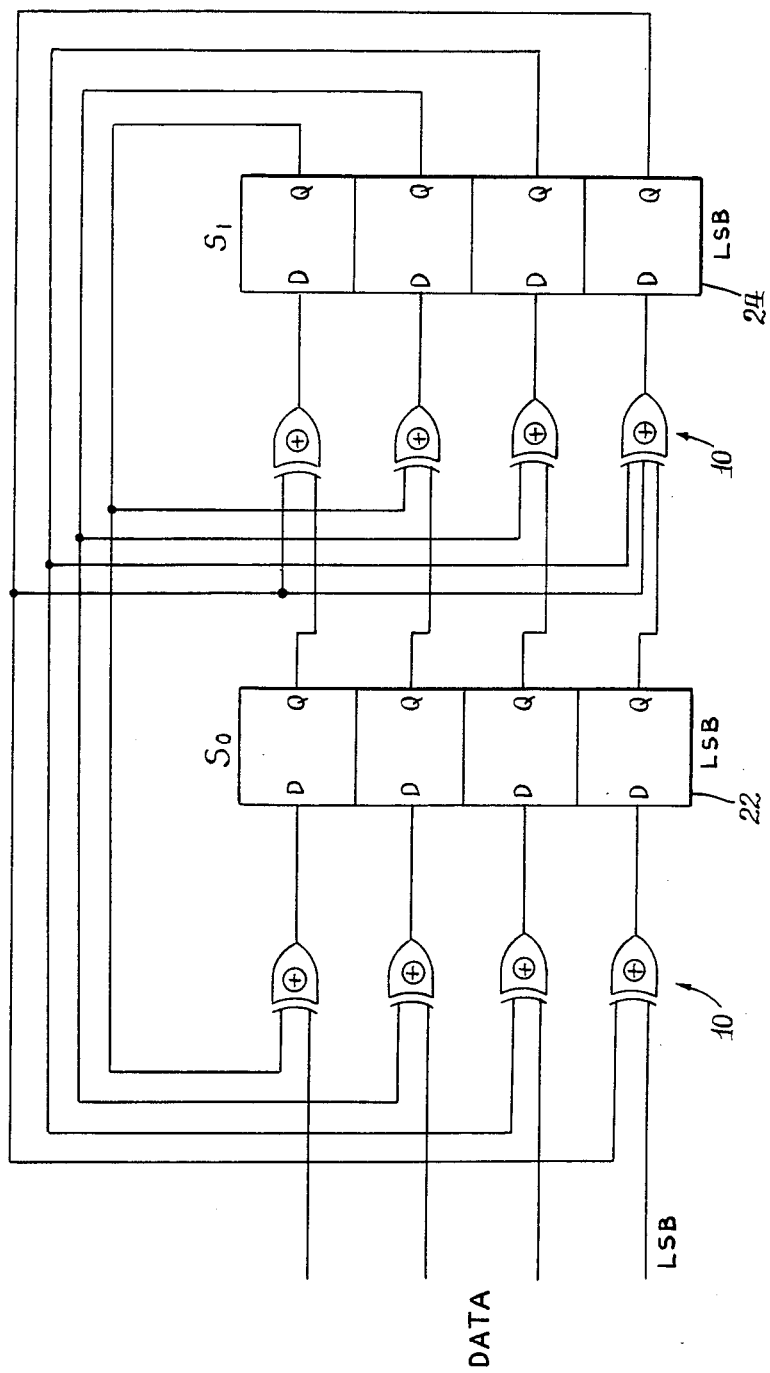
FIG. 3 is a diagrammatic illustration of a form of parity/syndrome generator known in the prior art for a byte-serial, bit-parallel encoding and recording system and/or playback, decoding and error correcting system.

In the particular embodiment set forth herein the Galois field is GF($2^4$), that is, GF(16). The particular Galois field is that developed by the field generator:

$$G_F(z) = z^4 + z + 1$$

with a primitive element $$\alpha = 0z^3 + 0z^2 + 1z^1 + 0z^0.$$

The Galois arithmetic is thus modulo $z^4+z+1$. The consequence of this is that there are 15 numbers in the Galois field, in addition to null, 0000, all being powers of $\alpha$ from 0 to 14 that can be stated as third order polynomials in the form $$F_3 z^3 + F_2 z^2 + F_1 z^1 + F_0 z^0$$

where the coefficients are binary 0 or 1 as set forth in TABLE I:

TABLE I

|  |  | $z^3$ | $z^2$ | $z^1$ | $z^0$ |
|---|---|---|---|---|---|
| $\alpha^0$ | = | 0 | 0 | 0 | 1 |
| $\alpha^1$ | = | 0 | 0 | 1 | 0 |
| $\alpha^2$ | = | 0 | 1 | 0 | 0 |
| $\alpha^3$ | = | 1 | 0 | 0 | 0 |
| $\alpha^4$ | = | 0 | 0 | 1 | 1 |
| $\alpha^5$ | = | 0 | 1 | 1 | 0 |
| $\alpha^6$ | = | 1 | 1 | 0 | 0 |
| $\alpha^7$ | = | 1 | 0 | 1 | 1 |
| $\alpha^8$ | = | 0 | 1 | 0 | 1 |
| $\alpha^9$ | = | 1 | 0 | 1 | 0 |
| $\alpha^{10}$ | = | 0 | 1 | 1 | 1 |
| $\alpha^{11}$ | = | 1 | 1 | 1 | 0 |
| $\alpha^{12}$ | = | 1 | 1 | 1 | 1 |
| $\alpha^{13}$ | = | 1 | 1 | 0 | 1 |
| $\alpha^{14}$ | = | 1 | 0 | 0 | 1 |

The cycle repeats in both directions, i.e., $\alpha^{15}=\alpha^0$, etc., and $\alpha^{-1}=\alpha^{14}$, etc. All coefficients of the data polynomial, the codeword polynomial and the code generator polynomial are thus in the Galois field, in powers of the primitive $\alpha$.

The particular code generator polynomial G(x) is $$G(x) = (x+\alpha^2)(x+\alpha^{13}) = x^2 + \alpha^{14}x + 1$$

In the record mode, the present invention provides a system for dividing blocks of incoming data in the form of a 14th order polynomial in x (with the coefficients $C_1$ and $C_0$ equal to 0) byte-parallel, bit-serial, by the code generator to obtain a remainder S(x) in the form $$S(x) = S_1 x + S_o$$

where $S_1$ and $S_0$ are coefficients in the Galois field in the form $$F_3 z^3 + F_2 z^2 + F_1 z^1 + F_0 z^0.$$

$S_1$ and $S_0$ are the parity bytes $P_1$ and $P_0$ in 4-bit form that, if added to the data block, forms a codeword polynomial exactly divisible by the code generator. The codeword may then be recorded byte-parallel, bit-serial as 15 4-bit bytes, with 13 data bytes and 2 parity bytes. (In the specific example for a 14 track recorder, one of the coefficient $C_{14}$ to $C_2$ is 0).

In the playback mode, the present invention provides a system for dividing the played back codewords by the code generator whereby the remainder S(x) is also in the form $$S(x) = S_1 x + S_o$$

and constitutes the syndrome, an error signal that contains information from which errors can be both identified and corrected, within the limits of the Reed-Solomon coding system. The present invention is not directed to their correction, which can be performed in the manner as generally explained by Berlekamp.

Operation in a Galois field may be simply implemented provided an appropriate Galois field is provided. In the Galois field GF(16) with field generator $$G_F(z) = z^4 + z + 1$$

multiplication by z may be effected by the multiplying circuit 8 illustrated in FIG. 1 utilizing a single exclusive OR-gate 10. That this is so may be shown by common algebra. Any number G(z) in the field may be identified by powers of z up to $z^{m-1}$. Where $m=4$, $$G(z) = F_3 z^3 + F_2 z^2 + F_1 z^1 + F_0 z^0$$

where the coefficients are binary 1 or 0. Multiplying by z, $$G(z)z = F_3 z^4 + F_2 z^3 + F_1 z^2 + F_0 z^1$$

Reducing this modulo $z^4 + z + 1$ $$G(z)z = F_2 z^3 + F_1 z^2 + (F_3 + F_0) z^1 + F_3 z^0$$

This function is performed by the multiplying circuit 8 of FIG. 1 wherein input bits $F_3$, $F_2$, $F_1$, $F_0$ in the order of most significant bit (MSB) to least significant bit (LSB) in an input register 12 are transformed to output bits $F_2$, $F_1$, $(F_3+F_0)$ and $F_3$ at an output register 14 using the exclusive-OR gate 10 and wired connections as shown.

Similarly, multiplication by $\alpha^{14}$, which is the same as $\alpha^{-1}$, may be effected by a multiplying circuit 16 as shown in FIG. 2 utilizing a single exclusive-OR gate 10 with input and output m-bit registers 18 and 20 connected as shown.

A known circuit for implementing parity and syndrome generation for Reed-Solomon encoding and error correction is shown in FIG. 3. Such circuit operates upon data received (or codewords) byte-serial, bit-parallel. The bytes are clocked serially into a first m-bit register 22 and thence into a second m-bit register 24. The outputs of the second register 24 are clocked back into a the first register 22, adding to the input bytes. Feedback from the output to the input of the second register includes the multiplying circuit 16 of FIG. 2 and provides multiplication by $\alpha^{14}$ in the aforementioned Galois field. In the case of a Reed-Solomon code RS(15, 13) in the parity generation mode, after 13 bytes of data are clocked in and then two null bytes, the first register 22 contains the parity byte $S_0$ ($P_0$) and the second register 24 contains the parity byte $S_1$ ($P_1$). In the syndrome generation mode, the 15 bytes of the codeword are clocked in to leave the syndrome bytes $S_0$, $S_1$ in the first and second registers 22, 24, respectively. Generation of parity and syndrome bytes thus takes n (15) bit cycles.

In FIG. 4 is illustrated a byte-parallel, bit-serial Reed-Solomon encoder with a parity/syndrome generator 26 according to the present invention for recording byte-parallel data on a multi-track digital tape recorder 28, specifically a 14-track instrumentation recorder in its recor-ding mode. 15 channels are illustrated, as that is the capacity of a Reed-Solomon RS (15, 13) code. To fit the 14-track recorder, one of the channels must contain all nulls in the Galois field. Data from a data source 30 are clocked in byte-parallel, bit-serial form into input latches 32 which serve to synchronize the data. Such data are then clocked into the parity/syndrome generator 26 and at the same time through to a data delay circuit 34. The parity/syndrome generator 26 operates upon a block of incoming data to develop parity bytes $P_1$ and $P_0$ at the parity outputs thereof in m (4) clock cycles. The parity signals are applied to respective parallel to serial converters 36 and 38 which convert the respective bytes $P_1$ and $P_0$ into bit-serial form. Clock pulses synchronize the delay in the data delay circuit 34 with the parity bits from the converters 36 and 38 to place the parity bits in synchronism with the data bits in the respective data blocks. The data and parity bits are applied through gate circuits 40 to output latches 42 and clocked synchronously into the recorder 28.

Figure 5:
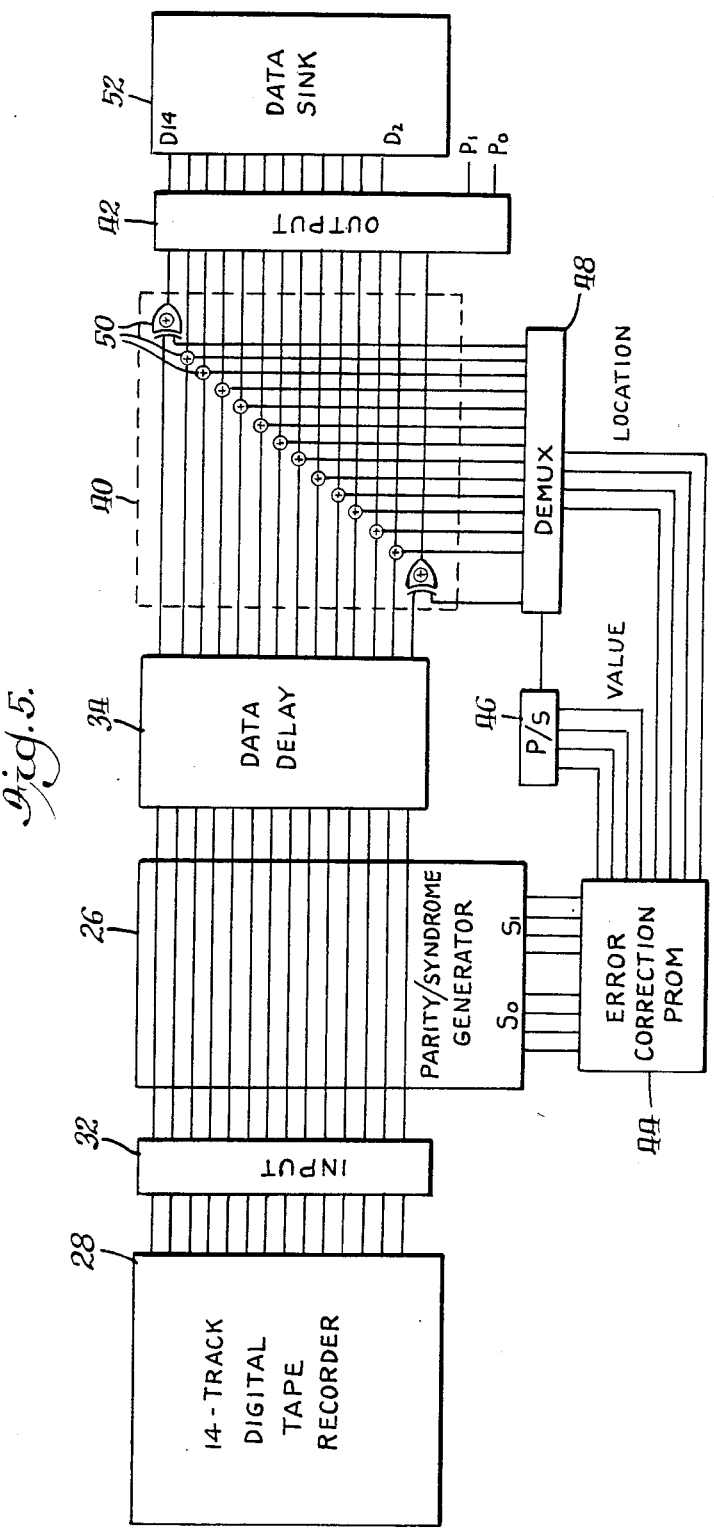
FIG. 5 is a diagrammatic illustration of a byte-parallel, bit-serial playback, decoding and error correcting system utilizing the parity/syndrome generator of the present invention.

In the playback mode, the recorder 28 is provided with an error correction system according to the principles of Berlekamp. Such system is illustrated in FIG. 5. The 14 bytes of codeword are clocked byte-parallel, bit-serial into the input latches 32. The codewords are clocked into the parity/syndrome register 26 and at the same time through to the data delay circuit 34. The parity/syndrome generator 26 operates upon a codeword to develop syndrome bytes $S_1$ and $S_0$ which, according to the Reed-Solomon principles as stated by Berlekamp, include information indicating the nature and position of any errors. Assuming no more than one erroneous coefficient per codeword, the errors can be corrected. The syndrome bytes are applied to an error correction $256 \times 8$ PROM 44 programmed according to the Berlekamp principles to provide a 4-bit error value signal applied in parallel to a parallel to serial converter 46 and a 4-bit error location signal applied to a demultiplexer 48. The error value signal, which indicates which bit or bits are in error, are applied serially to the demultiplexer 48, which thereupon acts to output the respective error value bits in proper synchronism to the particular byte line identified by the error location signal to contain an error. The error value bits are added to the bytes (data or parity) by the gate circuits 40 by means of respective exclusive-OR gates 50. As the bits are binary, the errors can only be having bits of the wrong sense. Adding an error value 1 bit by carry-less addition with an exclusive-OR gate 50 thus changes the sense and corrects an error. With two syndrome bytes $S_1$ and $S_0$, one and only one byte location can be identified unambiguously, and any of the errors in that byte can be identified and corrected. The corrected bytes are clocked byte-parallel, bit-serial into the output latches 42. The data bytes then pass to a data sink or utilization circuit 52, where the data may be processed.

Figure 6:
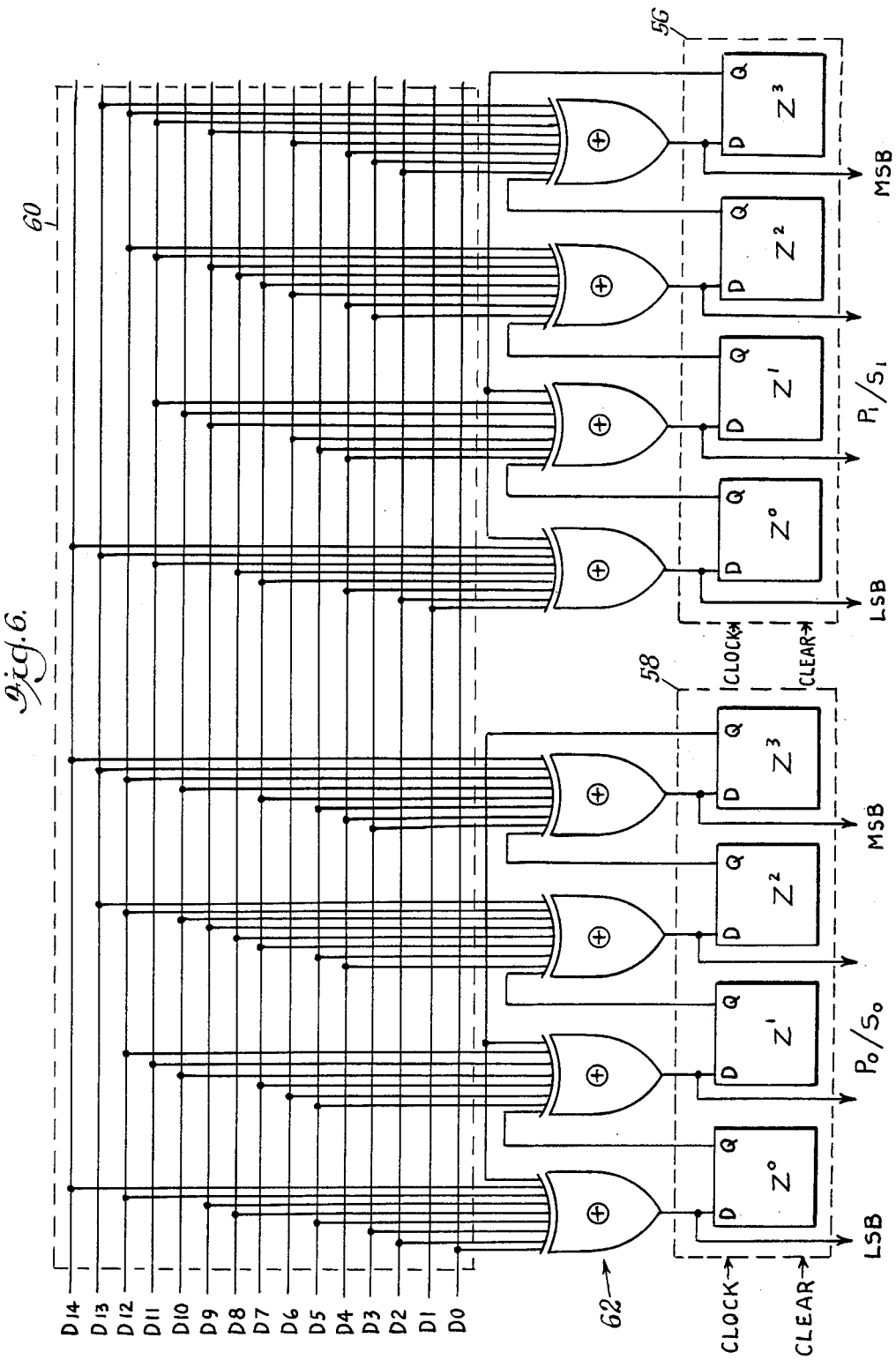
FIG. 6 is a diagrammatic illustration of one form of parity/syndrome generator according to the present invention as used in the systems illustrated in FIGS. 4 and 5 and utilizing the circuit illustrated in FIG. 1.

In FIG. 6 is illustrated a preferred form of parity/syndrome generator 26 of the present invention as applied to the encoder-recorder of FIG. 4 and the playback decoder-error corrector of FIG. 5. Because the particular error correcting system was designed for a 14-track instrumentation recorder 28, the system was designed for a (15, 13) Reed-Solomon code, that is one in which the data stream consists of codewords having 15 bytes, of which 2 bytes are parity bytes. In the above notation, $n = 2^m - 1 = 15$, $m = 4$. In such a code, the codewords will be in the form of the polynomial of 4-bit bytes of the form:

$$C(x) = C_{14}x^{14} + C_{13}x^{13} \ldots + C_1x^1 + C_0$$

Every codeword is a multiple of the code generator polynomial, i.e., every codeword can be divided exactly by the code generator with zero remainder. The code generator itself is a second order polynomial in the form $$g(x) = g_2x^2 + g_1x^1 + g_0$$

which in turn is the product of 2 factors $$g(x) = (x + \alpha^a)(x + \alpha^a)$$

where a and b are integers.

Polynomial division and Galois field multiplication as described in the Berlekamp patent is used. The particular Galois field utilized is that discussed at length above and designated by the Galois field generator $$g(x) = z^4 + z + 1$$

The particular code generator polynomial utilized is that stated above, $$g(x) = (x + \alpha^2)(x + \alpha^{13}) = x^2 + \alpha^{14}x + 1$$

As stated above, the present invention utilizes the properties of Galois field arithmetic to operate not only on one byte at a time but one bit thereof at a time. For example, each coefficient of a codeword is a power of $\alpha$ in the Galois field. Further, each power of $\alpha$ may be expressed as the sum of four parts, the most significant being $\alpha^3$ or 0, the next $\alpha^2$ or 0, the third $\alpha^1$ or 0 and the least significant $\alpha^0$ or 0. The entire codeword may then be divided into four parts, one with binary coefficients of $z^3$, a second with binary coefficients of $z^2$, a third with binary coefficients of $z^1$ and a fourth with binary coefficients of $z^0$. Each of these parts may be divided by the code generator polynomial, and the four resultant remainders may be summed in the Galois field to give the remainder identical to that determined by dividing the entire codeword at once. This is the block parity check (parity or syndrome) and permits simplicity of circuitry, as will now be explicated.

Taking first the least significant bits by themselves, $\alpha^0 x^{14}$ may be divided by the code generator polynomial by polynomial division, leaving a remainder $\alpha^0 x + \alpha^{14}$. $\alpha^0$ is equivalent to $$0z^3 + 0z^2 + 0z^1 + 1z^0.$$

This means that if the least bit of the coefficient of $x^{14}$ is 1, the remainder upon dividing by $x^2 + \alpha^{14}x + 1$ is $S_1 = 0001$ and $S_0 = 1001$. This remainder may be considered a first partial parity check (parity or syndrome). By making connections between the line carrying the byte for the coefficient $C_{14}$ to appropriate 4-bit registers 56, 58, when a 1 bit appears on that output line of the latches 32, the appropriate first partial parity check is entered in the registers. When a 0 bit appears, there is no remainder. Similar division in respect to each coefficient identifies the necessary connections, which may be arranged in an array 60 with respective connections being made through respective exclusive-OR gates 62 to respective inputs of the register 56, 58. The exclusive-OR gates 62 sum the input signals (first partial parity checks) modulo 2 without carry and provide the partial remainder or second partial parity check for the least significant bits.

It would be possible to perform the same polynomial division of the polynomial with $\alpha^1$ coefficients to develop a different array and a partial remainder (first partial parity check) for the next more significant bits, and so on for the $\alpha^2$ and $\alpha^3$ coefficients. The four first partial parity checks could then be summed to produce the desired block parity check $S_1x + S_0$. The present invention provides a simple circuit for effecting such further division and summation with the single array. This takes advantage of the fact that $\alpha^3 = \alpha^0 z^3$, $\alpha^2 = \alpha^0 z^2$ and $\alpha^1 = \alpha^0 z^1$ and that the bits are clocked in order of significance, the most significant first. Each clock period is the time between bits, and the term $z^{-1}$ is the delay operator in respect to the bits in the Galois field. Hence, if the dividend for the coefficient is multiplied by $z^3$, the remainder will be multiplied by the same $z^3$. If the most significant bits are applied in parallel to the array 60, the remainder can then be multiplied by $z^3$ to arrive at the remainder (second partial parity check) that would have resulted had the polynomial with $z^3$ coefficients been divided by the code generator.

The circuit of FIG. 1 may be used for such multiplication, and such circuit is provided by the feedback connections from the Q outputs of the registers 56, 58 to respective exclusive-OR gates 62 as shown in FIG. 5, that is, the output of the $z^0$ place is fed back to the $z^1$ place; the output of the $z^1$ place is fed back to the $z^2$ place; the output of the $z^2$ place is fed back to the $z^3$ place; and the output of the $z^3$ place is fed back to both the $z^0$ and the $z^1$ places. Thus, if the registers 56, 58 are cleared and the most significant bits are applied in parallel to the array 60, a partial remainder (first partial parity check) is developed for each of the n terms for the most significant bits, and these first partial parity checks are summed by the exclusive-OR gates 62 to form a second partial parity check. The sum is entered in the registers. Then, if no further signals are applied to the array 60, each clocking of the registers 56, 58 multiplies the contents of the registers by z. Three clockings of the register thus multiplies by $z^3$; hence after 3 clock pulses, the registers 56, 58 contain the summation partial remainder (a modified second partial parity check) for the most significant bits.

Similarly, if the $z^2$ bits are entered in the registers 56, 58, two clock pulses provide the proper summation partial remainder (modified second partial parity check) for the $z^2$ bits, and if the $z^1$ bits are entered in the registers 56, 58, one clock pulse provides the proper summation partial remainder (modified second partial parity check) for the $z^1$ bits. Direct entry of the $z^0$ bits provides the proper summation remainder (second partial parity check). Because of the properties of Galois field arithmetic as set forth above, the various operations may be superimposed. That is, after the registers 56, 58 are cleared the most significant bits ($z^3$) may be clocked into the array 60 to provide partial remainder bits (second partial parity check) in the registers 56, 58. Upon the next clock pulse, this partial remainder is multiplied by z and summed with the partial remainder (second partial parity check) from entry of the $z^2$ bits. Upon the next clock pulse, this combined partial remainder is multiplied by z and summed with the partial remainder (second partial parity check) from entry of the $z^1$ bits. Upon the next clock pulse, this combined partial remainder is multiplied by z and summed with the partial remainder (second partial parity check) from entry of the $z^0$ bits. Thus, the summation remainder (second partial parity check) in respect to the first bits ($z^3$ bits) is multiplied by $z^3$, the summation remainder (second partial parity check) in respect to second bits ($z^2$ bits) by $z^2$ and the summation remainder (second partial parity check) in respect to the third bits ($z^1$ bits) by $z^1$, and all four summation partial remainders as thus successively operated upon are summed by the exclusive-OR gates 62 and entered in the registers 56, 58 to provide the actual remainder $S_1x$, $S_0$ upon division of the input signals (data or codeword) by the code generator polynomial. This is the block parity check for parity or syndrome.

The clocking of data and other signals is performed in a conventional manner for both recording and playback. In recording, clock signals are provided from conventional clock means. These clock signals are applied at appropriate times to the various registers to assure deskewing of the bytes and proper synchronism of signals. The registers 56, 58 are cleared every four clock pulses just prior to entry of the first bits of the parallel bytes. After the four bits have been entered, the remainder (block parity check) is clocked into the parallel to serial converters 36, 38 and thereafter clocked out as the parity check bits at bit rate. Meanwhile the data bits are clocked through the data delay 34 to emerge in synchronism with the parity bits.

In playback, clock pulses are derived from the recorded data and used in a similar fashion to deskew the bytes and apply the bits successively to the various registers, clearing the registers 56, 58 every four bits. After the four bits have been entered and the syndrome (block parity check) $S_1$, $S_0$ determined by the syndrome generator 26, the syndrome bytes are clocked into the error correction PROM 44, the outputs of which are clocked into the parallel to serial converter 46 and the demultiplexer 48 in proper synchronism. Meanwhile the codewords are clocked through the data delay 34 so that its output bytes are synchronized with the error correction.

Although a parity/syndrome generator has been described which forms the remainder upon division of the data polynomial or the codeword polynomial by the code generator polynomial, it is equally possible to form remainders upon division of the data polynomial or the codeword polynomial by any of the factors of the codeword generator polynomial. In the example above, it is possible to obtain directly using circuits similar to that of FIG. 6, the two weighted power-sum symmetric functions $\bar{S}_{13}$ and $\bar{S}_2$ by dividing individually by each of the two first order factors of the Reed-Solomon code generator polynomial.

Although a particular parity/syndrome generator has been described for a given Reed-Solomon code, i.e., RS (15, 13), modification may be made therein for other Reed-Solomon codes. Other Galois fields may be used and other primitives. Other codewords may be used. Any linear code based upon elements of $GF(2^m)$ may be used. Any coset of a linear code based upon elements of $GF(2^m)$ may be used. The data blocks may have a different number of bytes per codeword, and there may be a different number of bits per byte.

A significant feature is that all bytes are applied in parallel, bit-serial, to a circuit acting in the Galois field to divide each single bit codeword by the code generator, and to means acting upon each clock pulse to multiply the resulting remainder in the Galois field by z, the inverse of delay operator, until all bits of a data block have been clocked in, at the same time adding the remainders from the division of successive bit codewords. The circuit shown in FIG. 5 was developed to serve the conventional order of bit processing wherein the most significant bits are entered first, followed by the other bits in order of significance. Should the bits be entered in the reverse order, the array 60 may be set up for division of the most significant bit and the feedback connections set to multiply by $z^{-1}$, as by using the circuit of FIG. 2. This is the same as operating in the Galois field defined by the reciprocal field generator polynomial and multiplying by the inverse of the delay operator of such field.

The invention is equally applicable to operation with coset codes. Coset codes are conventionally used in recording. One use is in synchronization, wherein fixed patterns may be added to the input data block to prevent the occurrence of particular bit streams, such as all 0's.

It should also be recognized that 0's and 1's are used herein to denote the two different binary logic levels and not whether one is plus or minus, true or untrue, etc.

What is claimed is:

1. A parity and/or syndrome generator for generating a block parity check for the detection and/or correction of errors in a multi-channel digital data communication system using a linear code or a coset of such code in which data and parity bytes are intended to be digitally encoded in n by m bit data blocks to form a respective codeword in n parallel bytes of m bits in serial order of significance in the form of a codeword having n elements represented by respective said bytes in the Galois field $GF(2^m)$, such Galois field being defined by an m-order field generator polynomial in integral powers of z between $z^0$ and $z^m$, where z is the inverse of the delay operator $z^{-1}$ of such Galois field, said parity generator and/or syndrome comprising:

first means responsive to byte-parallel data block bits of the same significance for producing a first partial parity check having m bits in each byte for the bit of said significance in each of the n elements of the respective codeword, second means for summing in the Galois field over all elements of the codeword said first partial parity checks to form a second partial parity check having m bits in each byte, a plurality of m-bit registers for registering bits, third means for multiplying the bit content of each of said m-bit registers by the inverse of the delay operator in the Galois field and producing respective m-bit products and summing said m-bit products to said second partial parity checks to form a third parity check having m bits in each byte, clock means for producing clock pulses, and means responsive to said clock pulses for synchronously clocking said data block bits in the order of significance byte-parallel into said first means, clocking said third parity check into said m-bit registers, and clearing said m-bit registers after m bits.

2. A parity and/or syndrome generator for the detection and/or correction of errors in a multi-channel digital data communication system using a cyclic code or a coset of such code in which data and parity bytes are intended to be digitally encoded in n by m bit data blocks to form a respective codeword in n parallel bytes of m bits in serial order of significance in the form of an n term codeword polynomial having coefficients of the respective n terms represented by respective said bytes in the Galois field $GF(2^m)$ which codeword polynomial is divisible in the Galois field by a code generator polynomial, such Galois field being defined by an m-order field polynomial in integral powers of z between $z^0$ and $z^m$, where z is the inverse of the delay operator $z^{-1}$ of such Galois field, said generator comprising:

first means responsive to byte-parallel data block bits of the same significance for producing a respective first remainder having m bits in each byte corresponding to the Galois field remainder resulting from division in the Galois field by said code generator polynomial of each of the n terms of the respective polynomial having as a coefficient a respective said bit of the same significance, second means for adding said first remainders in the Galois field to form a second remainder having m bits in each byte, a plurality of m-bit registers for registering bits, third means for multiplying the bit content of each of said m-bit registers by the inverse of the delay operator in the Galois field and producing respective m-bit products and adding said m-bit products to said second remainder to form a third remainder having m bits in each byte, clock means for producing clock pulses, and means responsive to said clock pulses for synchronously clocking said data block bits in the order of significance byte-parallel into said first means, clocking said third remainder into said m-bit registers, and clearing said m-bit registers after m bits.

3. A parity and/or syndrome generator for the detection and/or correction of errors in a multi-channel digital data communication system using a cyclic code or a coset of such code in which data and parity bytes are intended to be digitally encoded in n by m bit data blocks to form a respective codeword in n parallel bytes of m bits in serial order of significance in the form of an n term codeword polynomial having coefficients of the respective n terms represented by respective said bytes in the Galois field $GF(2^m)$ which codeword polynomial is divisible in the Galois field by a code generator polynomial, such code generator polynomial being the Galois field product of a plurality of factors, such Galois field being defined by an m-order field polynomial in integral powers of z between $z^0$ and $z^m$, where z is the inverse of the delay operator $z^{-1}$ of such Galois field, said generator comprising:

first means responsive to byte-parallel data block bits of the same significance for producing a respective first remainder having m bits in each byte corresponding to the Galois field remainder resulting from division in the Galois field by one of said factors of said code generator polynomial of each of the n terms of the respective polynomial having as a coefficient a respective said bit of the same significance, second means for adding said first remainders in the Galois field to form a second remainder having m bits in each byte, a plurality of m-bit registers for registering bits, third means for multiplying the bit content of each of said m-bit registers by the inverse of the delay operator in the Galois field and producing respective m-bit products and adding said m-bit products to said second remainder to form a third remainder having m bits in each byte, clock means for producing clock pulses, and means responsive to said clock pulses for synchronously clocking said data block bits in the order of significance byte-parallel into said first means, clocking said third remainder into said m-bit registers, and clearing said m-bit registers after m bits.

* * * * *

UNITED STATES PATENT AND TRADEMARK OFFICE
CERTIFICATE OF CORRECTION

PATENT NO. : 4,555,784
DATED : November 26, 1985
INVENTOR(S) : Roger W. Wood

It is certified that error appears in the above-identified patent and that said Letters Patent is hereby corrected as shown below:

Column 8, line 29, "recor-ding" should read --recording--;
Column 9, line 40, "$g(x)=(x+\alpha^a)(x+\alpha^a)$" should read
--$g(x)=(x+\alpha^a)(x+\alpha^b)$--;
Column 9, line 48, "$g(x)=z^4+z+1$" should read
--$g(z)=z^4+z+1$--;
Column 10, line 12, "$x^{14}\alpha$" should read --$x^{14}$--.

Signed and Sealed this

Eleventh Day of March 1986

[SEAL]

Attest:

DONALD J. QUIGG

Attesting Officer

Commissioner of Patents and Trademarks